United States Patent [19]

MacLauchlan et al.

[11] Patent Number: 5,684,406
[45] Date of Patent: Nov. 4, 1997

[54] ELECTROMAGNETIC ACOUSTIC TRANSDUCER FAULT DETECTION CIRCUIT

[75] Inventors: Daniel T. MacLauchlan, Lynchburg; Kenneth R. Camplin, Forest; Bradley E. Cox; Daniel Geier, both of Lynchburg, all of Va.

[73] Assignee: The Babcock & Wilcox Company, New Orleans, La.

[21] Appl. No.: 615,754

[22] Filed: Mar. 13, 1996

[51] Int. Cl.$^6$ .................................................. G01R 35/00
[52] U.S. Cl. .................. 324/700; 324/537; 324/557; 73/1 D; 73/1 DV
[58] Field of Search ..................................... 73/1 D, 1 DV; 340/454; 324/557, 558, 559, 537, 700

[56] References Cited

U.S. PATENT DOCUMENTS

| | | | |
|---|---|---|---|
| 1,811,765 | 6/1931 | Snelling | 324/700 |
| 4,806,849 | 2/1989 | Kihira | 324/559 |

FOREIGN PATENT DOCUMENTS

| | | | |
|---|---|---|---|
| 21797 | 2/1979 | Japan | 324/700 |
| 229011 | 10/1968 | U.S.S.R. | 324/700 |

*Primary Examiner*—Vinh P. Nguyen
*Assistant Examiner*—Jose M. Solis
*Attorney, Agent, or Firm*—Robert P. Bennett, Jr.; Robert J. Edwards

[57] ABSTRACT

A fault detecting circuit for use with an electromagnetic acoustic transducer having an electrostatic shield and a wear surface for determining when the wear surface for contacting test surfaces has developed holes.

16 Claims, 1 Drawing Sheet

ELECTROMAGNETIC ACOUSTIC TRANSDUCER FAULT DETECTION CIRCUIT

BACKGROUND OF THE INVENTION

1. Field of the Invention

The present invention relates to ultrasonic testing and, in particular, to a new and useful fault detection circuit for determining when a wear surface has worn through.

2. Description of the Related Art

Ultrasonic testing is often employed to inspect objects for defects, dimensions, material properties, etc. This is commonly accomplished by using a piezoelectric transducer. In such cases, the ultrasound is conducted from the transducer to the object via a coupling media such as water or a couplant gel. A new class of ultrasonic transducer, known as electromagnetic acoustic transducer (EMAT), is being used in many ultrasonic testing applications. Electromagnetic acoustic transducers are non-contact transducers in which ultrasound is launched and received in the surface of metals by electromagnetic means.

Two mechanisms are generally employed with electromagnetic acoustic transducers to generate and receive the ultrasound: Lorentz force and Magnetostriction.

In the case of the Lorentz force mechanism, a radio frequency (RF) coil is placed adjacent to the metal surface. A radio frequency current burst is passed through the coil setting up mirror image eddy currents in the metal. A static or quasi-static magnetic field is set up in the metal, in the area where the radio frequency eddy currents have been induced, using either an electromagnet or permanent magnets. The eddy currents experience a force produced by their interaction with the magnetic field known as a Lorentz force given by: $F=J\times H$, where F is the force, J is the current density, and J is the magnetic field.

This force is transferred to the material and, by proper design of the radio frequency coil and magnets, many different wave types can be generated. The ultrasound is detected by an electromagnetic acoustic transducer in a reciprocal process where an ultrasonic vibration under the radio frequency coil in the presence of a magnetic field induces a voltage in the radio frequency coil which can then be detected.

The magnetostrictive mechanism involves generating and receiving ultrasound in ferromagnetic materials through magnetic interactions. When a magnetic field is applied to a ferromagnetic material, the material experiences an internal stress. This process is known as magnetostriction.

The amount of stress generated depends on the magnitude of the magnetic field and the properties of the material. Electromagnetic acoustic transducers are employed for ferromagnetic materials where a static or quasi-static magnetic field is applied to the ferromagnetic material to bias the material into a region where a small change in magnetic field produces a large change in stress. A radio frequency coil is then driven with a radio frequency current burst to set up radio frequency magnetic fields in the surface of the material. These radio frequency fields set up stresses in the material surface which launch ultrasound into the material. Ultrasound is detected by a reciprocal process.

With either mechanism, the received signal strength falls off exponentially with increasing gap between the electromagnetic acoustic transducer coil and the metal surface. For many electromagnetic acoustic transducer applications, only a few thousands of an inch of gap between the coil and the metal surface can be tolerated. In many cases, this gap is best obtained by using a thin wear surface layer to insulate and protect the electromagnetic acoustic transducer coil from the metal surface.

Electromagnetic acoustic transducers are often used in automated scanning applications where the transducer slides over the surface of the material being inspected with light rubbing contact. It has been proposed to provide a very thin layer of metalized plastic between the radio frequency coil and the wear surface. The metalized plastic constitutes an electrostatic barrier which prevents capacitively coupled noise from the surface from reaching the radio frequency coil. The metalized plastic shield is grounded to the electromagnetic acoustic transducer preamplifier ground in order to short the noise to ground.

Alternately, an electrostatic shield may be comprised of a thin etched copper layer with a pattern of blank lines etched in the copper such that the layer serves to pass the radio frequency magnetic fields unhindered while effectively blocking the electrostatic noise from reaching the radio frequency coil.

Eventually, the wear surface may wear or tear through exposing the shield and radio frequency coil. The coil may then short to the metal part resulting in a loss of signal or noisy signal. In an automated test, the degradation of the sensor may go unnoticed for some length of time and corrupt the test during this time. A means of detecting when the wear surface has initially worn through is needed so that the transducer can be changed before the testing becomes corrupted.

SUMMARY OF THE INVENTION

In accordance with the invention, an electric circuit is employed for an EMAT assembly to indicate degradation of a wear surface placed over the radio frequency coil. The circuit detects when the radio frequency coil's electrostatic shield makes contact with a grounded test surface.

Accordingly, it is a further object of the invention to provide a detection circuit which will alert the user to replace a protective wear surface before having to replace the entire transducer assembly, which the wear surface is meant to protect.

In a preferred embodiment of the invention, a DC-powered sensing circuit is operatively connected to an electrostatic shield of a shielded radio frequency coil assembly. The sensing circuit contains a logic device for determining when the voltage on the electrostatic shield drops below approximately 1.0 volt and also contains a device for indicating to the user when the short circuit condition detected by the logic system has occurred and finally the circuit contains a reset switch for returning the circuit to its sensing mode from the fault indicating mode.

In accordance with a feature of the invention, the logic device of the circuit is preferentially a logic flip-flop having a Q and a Q "NOT" output to be connected to the short circuit indicating device. When a logic flip-flop is used, the Q "NOT" output of the device is utilized since in the sensing mode of the circuit, the Q "NOT" output will be high or approximately +5 volts. In this state, it prevents a current from flowing through the indicator device.

In accordance with a further aspect of the invention, the indicating device of the invention is preferentially a light emitting diode in series with an optically coupled switch connected between a +5 volt DC source and the Q "NOT" output of the logic flip-flop.

Additionally, the reset switch portion of the device has a resistor connected between the 5 volt voltage source and the clear input of the logic flip-flop combined with a capacitor connected between the clear input and ground and a second resistor in series with a switch connected between the clear input and ground.

In accordance with another feature of the invention, a network of capacitors and resistors is attached between the electrostatic shield and ground to remove capacitively coupled high frequency noise from the circuit.

The various features of novelty which characterize the invention are pointed out with particularity in the claims annexed to and forming a part of this disclosure. For a better understanding of the invention, its operating advantages and specific objects attained by its uses, reference is made to the accompanying drawing and descriptive matter in which a preferred embodiment of the invention is illustrated.

BRIEF DESCRIPTION OF THE DRAWINGS

In the drawing sole figure:

Shown is an electro-mechanical schematic view showing the circuit of the present invention and its connection to an electromagnetic acoustic transducer.

DESCRIPTION OF THE PREFERRED EMBODIMENTS

Figure 1:
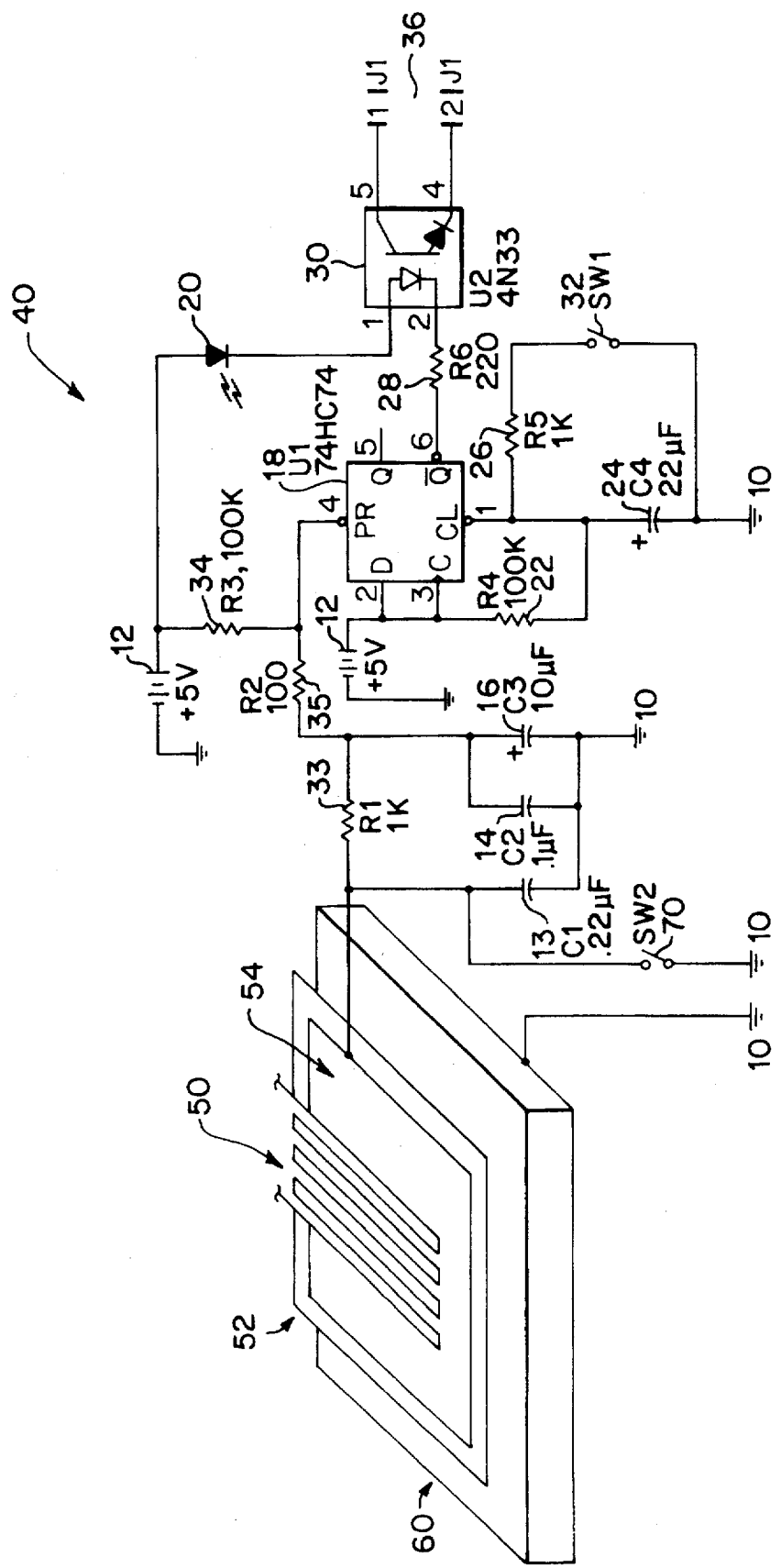

In the drawing, an electromagnetic acoustic transducer coil 50 is shown assembled with an electrostatic shield 54 and a wear surface 52 that is in contact with a metallic test surface 60. The test surface 60 is shown having a connection to a common ground 10.

The electrostatic shield 54 is connected to a sensing circuit 40.

The sensing circuit 40 receives power from a DC voltage source 12, preferentially +5 volts for use with standard digital electronics. The DC voltage source 12 is applied to the electrostatic shield 54 through current limiting resistors 33, 34 and 35. A first high frequency filter capacitor 13 is connected to a node between electrostatic shield 54 and first current limiting resistor 33, and to ground 10. This is to short high frequency noise capacitively coupled from the test subject 60 to the electrostatic shield 54 to the common ground 10. Since electromagnetic acoustic transducers typically operate between 0.1 Mhz. and 10 Mhz., capacitively shorting the noise to ground is adequate. For this reason, a capacitor with a value of 0.22 µF is preferentially used in this circuit.

The DC voltage source 12 is also applied through resistor 34 to pin 4 of logic flip-flop 18. Logic flip-flop 18 has six connecting pins. Pin 1 is a clear input, pin 2 is a C input, pin 3 is a D input, pin 4 is a preset input and pins 5 and 6 are Q and Q "NOT" outputs, respectively. A 74HC74 type of flip-flop may be used with this invention.

Resistor 35 and resistor 33, which are connected in series, connect the electrostatic shield 54 to pin 4 of flip flop 18. Resistors 35 and 33 have values of 100 Ohms and 1 k Ohms respectively. A 10 µF capacitor 16 and a 0.1 µF capacitor 14 are connected with the positive terminals attached to a junction of resistors 33 and 35 and the negative terminals of the capacitors 14, 16 are connected to ground. This resistor/capacitor network is used to filter noise in the fault detection circuit away from the electrostatic shield 54.

If the wear surface 52 wears through at any point, the electrostatic shield 54 comes into contact with the test surface 60. When the electrostatic shield 54 contacts the test surface 60, the DC voltage on the electrostatic shield 54 is then shorted to common ground 10. When the voltage on shield 54 drops below a certain level (approximately 1.0 volt) the logic flip-flop 18 is set causing Q "NOT" output pin 6 to go low. This in turn causes current to flow through a light emitting diode indicator 20, optical coupler switch 30, and current limiting resistor 28. This current flow illuminates light emitting diode indicator 20 and causes a optical coupler switch 30 to close, allowing for remote sensing of the fault condition via connector 36.

Reset switch 32 is connected between ground 10 and clear input pin 1 of logic flip-flop 18 via a current limiting resistor 26. The circuit can be reset when the fault has been cleared by closing the reset switch 32.

Pull up resistor 22 is connected from the DC voltage source 12 to the clear input pin 1 of logic flip-flop 18 to apply the DC voltage 12 to the clear input pin 1 of the logic flip-flop 18, when the reset switch 32 is open. Clear input capacitor 24 is connected from the clear input pin 1 of logic flip-flop 18 to common ground 10. The values of pull up or clear input resistor 22 and clear input capacitor 24 are chosen such that during the power up of the sensing circuit 40, the voltage on the clear input pin 1 rises slower than on the preset input pin 4 of logic flip-flop 18, causing the circuit 40 to come up in the cleared state. This results in both LED indicator 20 and optical coupler switch 30 being in their off or non-operating state.

One set of values for the pull up resistor 22 and clear input capacitor 24 is 100 kOhms and 22 µF, respectively. Current limiting resistors 34, 28, 26 preferentially have values of 100 kOhms, 220 Ohms and 1 kOhms, respectively. The optical coupler switch 30 is preferably a type 4N33. It should be noted that although specific values have been given for these components, the circuit may utilize components with different values and still achieve similar results.

A test switch 70 can be connected to the circuit 40 between electrostatic shield 54 and common ground 10. When test switch 70 is open, the circuit remains in the sensing mode until a short circuit between the shield 54 and ground 10 is detected. When switch 70 is closed, the shield 54 is grounded and a short circuit results. If circuit 40 is operating properly, LED indicator 20 and optical coupler switch 30 will be in their on, or operating state.

While a specific embodiment of the invention has been shown and described in detail to illustrate the application of the principles of the invention, it will be understood that the invention may be embodied otherwise without departing from such principles.

What is claimed is:

1. A fault detection circuit for detecting surface wear in an assembly having a wear surface removably connected to an electromagnetic acoustic transducer for contacting a metallic test surface connected to a ground, an electromagnetic shield interposed between the wear surface and the electromagnetic acoustic transducer, the electromagnetic shield interposed between the wear surface and means for generating and receiving ultrasound from the metallic test surface, the circuit comprising a DC-powered circuit operatively connected to the electromagnetic shield for detecting a short circuit responsive to the wearing through of the wear surface.

2. The fault detection circuit according to claim 1, wherein the DC-powered circuit includes a means for indicating the short circuit to a user.

3. The fault detection circuit according to claim 1, wherein the DC-powered circuit includes a testing means for testing the circuit.

4. The fault detection circuit according to claim 1, wherein the DC-powered circuit includes resetting means for resetting the circuit after the short circuit has been detected.

5. The fault detection circuit according to claim 2, wherein the means for indicating the short circuit comprises at least one of a light emitting diode, a light bulb and means for making a noise.

6. The fault detection circuit according to claim 1, wherein the DC-powered circuit includes a digital logic flip-flop.

7. The fault detection circuit according to claim 1, wherein the DC-powered circuit comprises:

a DC voltage source having a high potential and a low potential, the low potential being connected to the ground;

a first current limiting means connected to the high potential of the DC voltage source, and to the electrostatic shield;

a logic circuit having a means for determining when a voltage across the electrostatic shield is substantially 0 volts, an output, and connected to the first current limiting means and to the DC voltage source;

a first filtering means for filtering capacitively coupled noise from the electrostatic shield to ground connected between the electrostatic shield and the ground;

a second filtering means for filtering noise in the DC powered circuit to ground connected between the first current limiting means and the ground;

means for indicating the short circuit to a user connected between the DC voltage source and the output of the logic circuit; and means for resetting the circuit after the short circuit has been detected connected to the logic flip-flop.

8. The fault detection circuit according to claim 7, wherein the logic circuit comprises a logic flip-flop having a "D" input, a "C" input, a "clear" input, a "preset" input, a "Q" output and a Q "NOT" output, the "C" input and the "D" input electrically connected to the high potential of the DC voltage, and the "preset" input electrically connected to the first current limiting means, and the indicating means connected to the Q "NOT" output of the logic flip-flop.

9. The fault detection circuit of claim 8, wherein the resetting means comprises a reset current limiting resistor connected between the "clear" input and a switch, the switch connected between the reset current limiting resistor and the ground, a pull up resistor connected between the "clear" input and the "D" input, the "C" input and the voltage source, a clear input capacitor connected between the "clear" input and the ground, the clear input capacitor and pull up resistor having values selected to cause a voltage at the "clear" input to rise slower than a voltage at the "preset" input when power is applied to the DC-powered circuit.

10. The fault detection circuit of claim 9, wherein the first filtering means comprises at least one high frequency filter capacitor connected between the electrostatic shield and the ground.

11. The fault detection circuit of claim 10, wherein the second filtering means comprises a plurality of noise filtering capacitors connected in parallel between the current circuit limiting means and the ground.

12. The fault detection circuit of claim 11, wherein the indicating means comprises a light emitting diode oriented between the high potential of the voltage source and an optically coupled switch having a positive bias direction toward the optically coupled switch;

the optically coupled switch having a pair of outputs connected by a second means for indicating the short circuit; and an indicator current limiting resistor connected between the optically coupled switch and the Q "NOT" output of the logic flip-flop.

13. The fault detection circuit according to claim 12, wherein the first current limiting means comprises at least one shield current limiting resistor connected between the electrostatic shield and the "preset" input, and at least one source current limiting resistor connected between the high potential and the "preset" input.

14. The fault detection circuit according to claim 13, wherein the at least one shield current limiting resistor comprises a 1 kOhm resistor connected in series with a 100 Ohm resistor.

15. The fault detection circuit according to claim 14, wherein the at least one source current limiting resistor is a 100 kOhm resistor.

16. The fault detection circuit of claim 15, wherein the DC-powered circuit comprises:

the DC voltage source being essentially a positive 5 Volt source;

the at least one high frequency filter capacitor comprises essentially a 0.22 µF capacitor;

the plurality of noise filter capacitors comprises essentially a 0.1 µF capacitor and a 10 µF capacitor;

the indicator current limiting resistor is a 220 Ohm resistor;

the reset current limiting resistor is a 1 kOhm resistor;

the pull up resistor is a 100 kOhm resistor;

the clear input capacitor is a 22 µF capacitor;

the logic flip-flop is a type 74HC74 chip; and the optically coupled switch is a model 4N33 chip.

* * * * *